(12) United States Patent
Savoj

(10) Patent No.: US 7,016,613 B2
(45) Date of Patent: Mar. 21, 2006

(54) LINEAR HALF-RATE PHASE DETECTOR AND CLOCK AND DATA RECOVERY CIRCUIT

(75) Inventor: Jafar Savoj, Sherman Oaks, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/027,615

(22) Filed: Dec. 30, 2004

(65) Prior Publication Data

US 2005/0117404 A1    Jun. 2, 2005

Related U.S. Application Data

(63) Continuation of application No. 09/782,687, filed on Feb. 12, 2001, now Pat. No. 6,847,789.

(60) Provisional application No. 60/183,170, filed on Feb. 17, 2000.

(51) Int. Cl.
H04B 10/00 (2006.01)
H03D 3/24 (2006.01)
H03L 7/06 (2006.01)

(52) U.S. Cl. ................. 398/155; 375/374; 375/375; 327/157; 327/159

(58) Field of Classification Search ............. 398/137, 398/154, 155; 327/144, 157, 159, 156; 375/360, 375/374, 373, 371, 359, 234, 354, 376, 236, 375/355; 331/1 R, 25, 1 A
See application file for complete search history.

(56) References Cited

U.S. PATENT DOCUMENTS 4,071,905 A   1/1978  Oguchi et al.
4,535,459 A   8/1985  Hogge, Jr.

(Continued)

FOREIGN PATENT DOCUMENTS

JP    07099515 A  *  4/1995

(Continued)

OTHER PUBLICATIONS

"Analysis of a charge-pump PLL: a new model"; Van Paemel; IEEE Transactions on Communications, vol. 42, Issue 7, Jul. 1994, pp. 2490-2498.*
C.R. Hogge, Jr., "A Self Correcting Clock Recovery Circuit", IEEE Journal of Lightwave Technology, vol. LT-3, No. 6, Dec. 1985.

(Continued)

Primary Examiner—M. R. Sedighian
Assistant Examiner—Nathan Curs
(74) Attorney, Agent, or Firm—Christie, Parker & Hale, LLP

(57) ABSTRACT

Method and apparatus for recovering a clock and data from a data signal. One method of the invention includes receiving the data signal having a first data rate, receiving the clock signal having a first clock frequency, alternating between a first level and a second level, wherein the first data rate is twice the first clock frequency. A first signal is generated by passing the data signal when the clock signal is at the first level, and storing the data signal when the clock signal is at the second level. A second signal is generated by passing the data signal when the clock signal is at the second level, and storing the data signal when the clock signal is at the first level. A third signal is generated by passing the first signal when the clock signal is at the second level, and storing the first signal when the clock signal is at the first level. A fourth signal is generated by passing the second signal when the clock signal is at the first level, and storing the second signal when the clock signal is at the second level. An error signal is generated by taking the exclusive-OR of the first signal and the second signal, and a reference signal is generated by taking the exclusive-OR of the third signal and the fourth signal.

26 Claims, 13 Drawing Sheets

U.S. PATENT DOCUMENTS

| | | | |
|---|---|---|---|
| 5,301,196 | A | 4/1994 | Ewen et al. |
| 5,799,048 | A | 8/1998 | Farjad-Rad et al. |
| 6,072,337 | A * | 6/2000 | Dalmia et al. ............... 327/12 |
| 6,121,804 | A | 9/2000 | Bryan et al. |
| 6,181,756 | B1 * | 1/2001 | Moloudi .................... 375/374 |
| 6,211,741 | B1 * | 4/2001 | Dalmia ....................... 331/11 |
| 6,424,194 | B1 | 7/2002 | Hairapetian |
| 6,559,715 | B1 * | 5/2003 | Frake et al. ............... 327/558 |

FOREIGN PATENT DOCUMENTS

| | | |
|---|---|---|
| WO | WO 01/06696 | 1/2001 |
| WO | WO 01/63767 | 8/2001 |

OTHER PUBLICATIONS

E. Mullner, "A 20 Gb/s Parallel Phase Detector and Demultiplexer Circuit in a Production Silicon Bipolar Technology with fT=25 GHz", Proc. IEEE BCTM, pp. 43-45, Oct. 1996.

M. Rau et al., "Clock/Data Recovery PLL Using Half-Frequency Clock", IEEE Journal of Solid-State Circuits, vol. 32, No. 7, Jul. 1997.

K. Nakamura et al., "A 6 Gb/s CMOS Phase Detecting DEMUX Module Using Half-Frequency Clock", IEEE 1998 Symposium on VLSI Circuits Digest of Technical Papers.

M. Wurzer et al., "40-Gb/s Integrated Clock and Data Recovery Circuit in a Silicon Biopolar Technology", IEEE BCTM 8.1, 1998.

Jafar Savoj et al., "A 10-Gb/s CMOS Clock and Data Recovery Circuit", IEEE 2000 Symposium on VLSI Circuits Digest of Technical Papers.

"Analysis of a charge-pump PLL: a new model"; Van Paemel; IEEE Transactions on Communications, vol. 42, Issue 7, Jul. 1994, pp. 2490-2498.

* cited by examiner

LINEAR HALF-RATE PHASE DETECTOR AND CLOCK AND DATA RECOVERY CIRCUIT

CROSS-REFERENCES TO RELATED APPLICATIONS

This application is a continuation of U.S. patent application Ser. No. 09/782,687, filed Feb. 12, 2001, now U.S. Pat No. 6,847,789, the disclosure of which is hereby incorporated by reference herein. This application claims priority from U.S. Provisional Application No. 60/183,170, filed Feb. 17, 2000, the disclosure of which is hereby incorporated by reference herein.

BACKGROUND

The present invention relates generally to phase-locked loops, and more specifically to linear half-rate phase detectors and clock and data recovery circuits.

Data networking has exploded over the last several years, and has changed the way people work, get information, and spend leisure time. Local Area Networks (LANs) in the workplace allow for centralized database and file sharing and archiving. Wireless Application Protocol (WAP) enabled mobile phones operating over a Wide Area Network (WAN) allow users to access news updates and stock quotes. The Internet has transformed shopping and research, and has spawned a new recreational activity—Web surfing. Many computers are used primarily as interfaces to these networks, thus the expression "the network is the computer" has become popularized.

Devices such as Network Interface Cards (NICs), bridges, routers, switches, and hubs move data between users, between users and servers, or between servers. Data moves over a variety of media such as fiber optic or twisted pair cables, and the air. These media are similar in that they distort data, making it difficult to be read by a receiving device. Light-waves in a fiber optic cable travel not only down the cable's core, but bounce off the core-cladding interface, and thus tend to disperse. Twisted pair cables have filtering properties that tend to attenuate higher frequencies. This limited bandwidth also creates interference between individual data bits, known as Inter-Symbol Interference (ISI). Wireless signals tend to bounce off buildings and other surfaces in a phenomenon known as multipath, which results in the smudging of one data bit into the next.

Therefore, each of these devices, NICs, bridges, routers, switches, and hubs, receive distorted data and must "clean it up", or retime it, for use either by the device itself, a device attached to it, or for re-transmission. A useful building block for this is the phase-locked loop (PLL). PLLs accept distorted data, and provide a CLOCK signal and retimed (or recovered) data as outputs.

But the task for PLLs has lately begun to be a lot tougher. Equipment operating at data rates of one Gigabit per second is replacing 100 Megabit devices, which recently replaced 10 Megabit units. Exacerbating this problem is the competitive nature of the networking business itself. Pricing pressures are enormous, and using high speed, specialized processes raises system costs. Therefore, the goal is to create integrated circuits that are capable of operating at these data rates, but which can be made using relatively inexpensive process technologies. What is needed are PLLs which can be made inexpensively, while still operating at these high frequencies.

SUMMARY

Accordingly, the present invention provides a clock and data recovery circuit. A voltage-controlled oscillator (VCO) operates at half the data rate. A half-rate phase detector provides two quadrature demultiplexed data outputs, as well as a differential pattern independent linear output made up of an error signal and a reference signal. The lower clock rate enables the circuit to be manufactured using a less expensive process. Similarly, signals having higher data rates may be recovered using the same process, as compared to other circuits. The linear output generates less supply noise than other architectures. The reduction of pattern dependency reduces the pattern dependent offset phase errors that would otherwise be present.

Specifically, one exemplary embodiment of the present invention provides a method of recovering a clock and data from a data signal. The method includes receiving the data signal having a first data rate, receiving a clock signal having a first clock frequency, alternating between a first level and a second level, wherein the first data rate is twice the first clock frequency. A first signal is generated by passing the data signal when the clock signal is at the first level, and storing the data signal when the clock signal is at the second level. A second signal is generated by passing the data signal when the clock signal is at the second level, and storing the data signal when the clock signal is at the first level. A third signal is generated by passing the first signal when the clock signal is at the second level, and storing the first signal when the clock signal is at the first level. A fourth signal is generated by passing the second signal when the clock signal is at the first level, and storing the second signal when the clock signal is at the second level. An error signal is generated by taking the exclusive-OR (XOR) of the first signal and the second signal, and a reference signal is generated by taking the XOR of the third signal and the fourth signal.

This embodiment may further include applying the error signal and the reference signal to a charge pump to generate a charge pump output.

A further exemplary embodiment of the present invention provides an apparatus for recovering data from a received data signal. The apparatus includes a first storage device configured to generate a first signal by receiving the received data signal, and either passing the received data signal or storing the received data signal, and a second storage device configured to generate a second signal by receiving the received data signal, and either passing the received data signal or storing the received data signal.

The embodiment further provides a third storage device configured to generate a third signal by receiving the first signal, and either passing the first signal or storing the received first signal, and a fourth storage device configured to generate a fourth signal by receiving the second signal, and either passing the second signal or storing the second signal. A first logic gate configured to perform an exclusive-OR of the first signal and the second signal; and a second logic gate configured to perform an exclusive-OR of the third signal and the fourth signal are also included. When the first storage device passes the received data, the second storage device stores the received data, the third storage device stores the first signal, and the fourth storage device passes the second signal. When the first storage device stores the received data, the second storage device passes the received data, the third storage device passes the first signal, and the fourth storage device stores the second signal.

Yet a further exemplary embodiment of the present invention provides an apparatus for recovering data from a received data signal. The apparatus include a first storage device having a data input coupled to a first data input port, a clock input coupled to a first clock port and a second storage device having a data input coupled to the first data input port, a clock input coupled to a second clock port. The apparatus also includes a third storage device having a data input coupled to an output of the first storage device, and a clock input coupled to the second clock port and a fourth storage device having a data input coupled to an output of the second storage device, and a clock input coupled to the first clock port. A first exclusive-OR gate having a first input coupled to the output of the first storage device and the second storage device; and a second exclusive-OR gate having a first input coupled to an output of the third storage device and the fourth storage device are also included. The first, second, third, and fourth storage devices couple a signal at the data input to the output when a voltage on the clock input is a high, store the signal at the data input when the voltage on the clock input is a low.

A better understanding of the nature and advantages of the present invention may be gained with reference to the following detailed description and the accompanying drawings.

DETAILED DESCRIPTION

Figure 1:
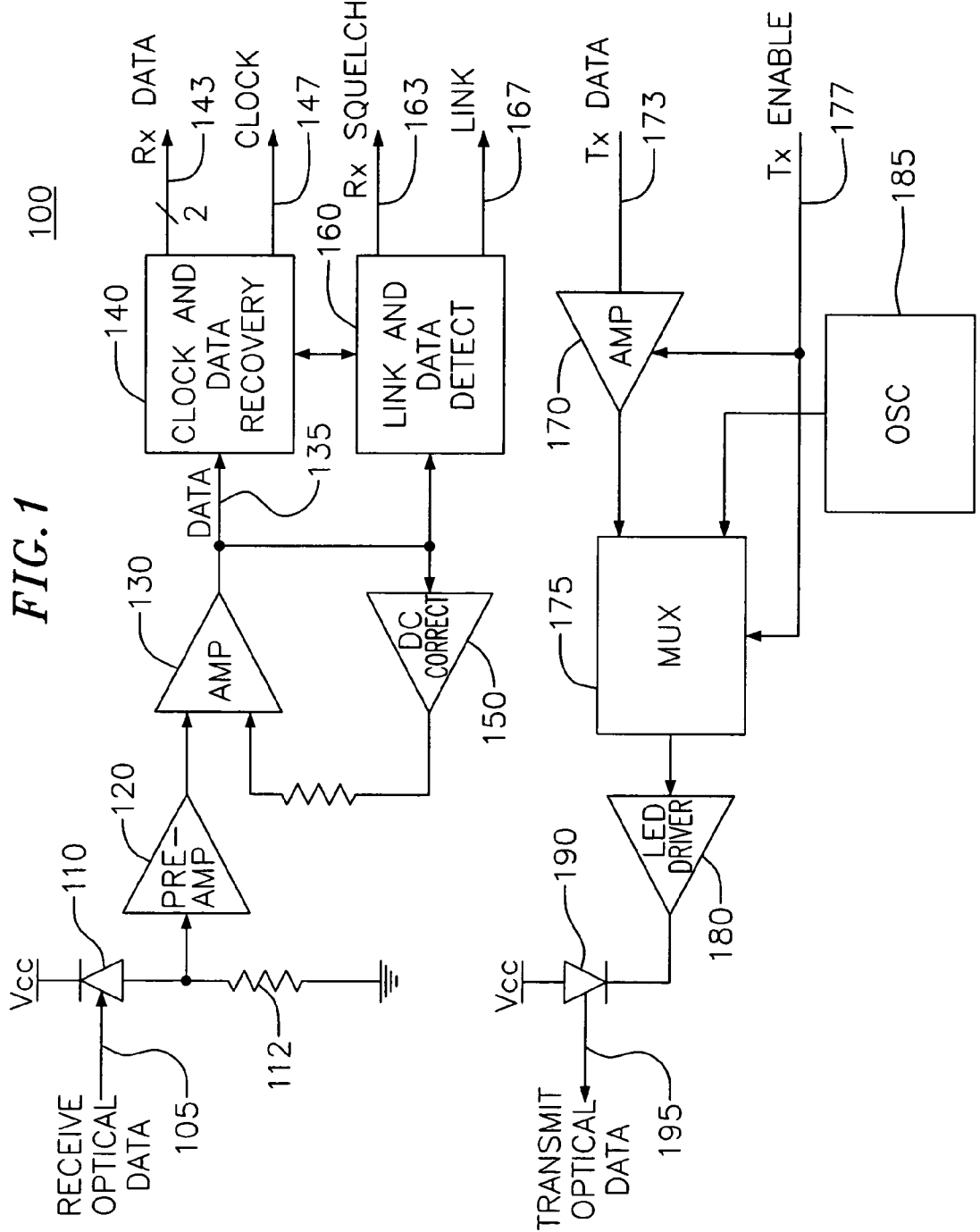
FIG. 1 is a block diagram of an exemplary optical transceiver that incorporates one embodiment of the present invention.

FIG. 1 is an exemplary block diagram for an optical transceiver which incorporates one embodiment of the present invention. This figure, as with all the included figures, is for illustrative purposes, and does not limit the possible applications of the present invention, or limit the appended claims. This optical transceiver may be on a NIC card with a media access controller, some memory, and other circuits. Included is a receive path including a photo diode 110, sensing resistor 112, pre-amplifier 120, amplifier 130, DC offset correction circuit 150, clock and data recovery circuit 140, and link and data detect 160. A transmit path having an amplifier 170, Light Emitting Diode (LED) driver 180, multiplexer 175, oscillator 185, and LED 190 is also shown.

A receive fiber optic cable 105 carries an optical data signal to the reversed-biased photo diode 110. Photo diode 110 senses the amount of light from fiber optic cable 105, and a proportional leakage current flows from the device cathode to anode. This current flows though sense resistor 112, thereby generating a voltage. This voltage is amplified by pre-amplifier 120, and sent to amplifier 130. DC offsets are reduced by DC correction circuit 150. The output of the amplifier 130 drives the clock and data recovery circuits 140, as well as the link and data detect block 160. The clock and data recovery circuits extract the CLOCK signal embedded in the data provided on line 135 by the amplifier, and uses it to retime the data for output on lines 143. If the link and data detect block 160 senses either a data or link signal at the data line 135, a valid link signal is asserted on line 167. If the link and data detect block 160 senses a data signal at the data line 135, a receive squelch signal is de-asserted on line 163.

Transmit data is provided on line 173 to amplifier 170. Amplifier 170 is enabled by the transmit enable signal on line 177. When amplifier 170 is enabled, transmit data is passed to the multiplexer 175. Multiplexer 175 passes the transmit data to the LED driver 180 which in turn generates a current through light emitting diode (LED) 190. When current is driven through LED 190, light is emitted and transmitted on fiber optic cable 195. When the LED driver 180 is not driving current though LED 190, the LED is off, and the fiber optic cable 195 is dark. If the amplifier 170 is disabled, multiplexer 175 selects the idle signal from oscillator block 185. Oscillator block 185 provides an idle signal through the multiplexer 175 to the LED driver 180. This idle signal is used by the receiver to ensure that a valid optical connection has been made at both ends of the fiber-optic cable 105.

As discussed above, the physical media limitations distort the received signal. Moreover, the delay through the amplifier 170, multiplexer 175, LED driver 180, and LED 190 may not be the same for a light-to-dark as for a dark-to-light transition. This mismatch causes what is referred to as a duty cycle distortion. Further, electrical noise in the power supply and data path create jitter and phase noise, which is where the delay through the transmitter changes as a function of time. It is the function of clock and data recovery circuits, such as block 140, to retime the data so it is in a more useable form for digital circuits, and provide a CLOCK synchronized to the data.

Figure 2:
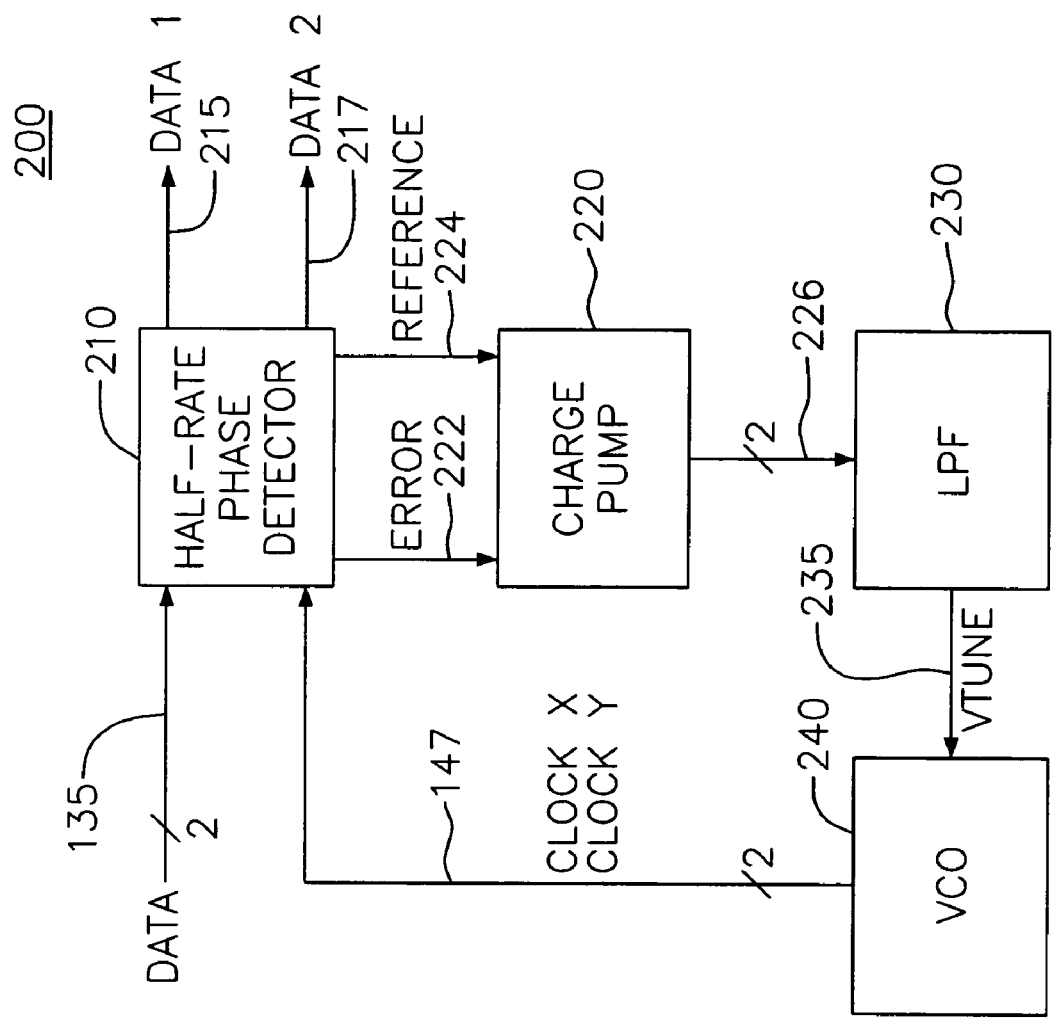
FIG. 2 is a block diagram of a clock and data recovery circuit consistent with one embodiment of the present invention.

FIG. 2 is a block diagram of a clock and data recovery circuit 200, which may be used as block 140 in FIG. 1, as well as many other applications. This architecture is shown for exemplary purposes, and does not limit either the possible applications of the present invention, or the appended claims. Other architectures will be readily apparent to those skilled in the art. For example, the charge pump may be included in the low-pass filter. Included in FIG. 2 are a half-rate phase detector 210, charge pump 220, low-pass filter 230, and VCO 240.

A differential data input is provided to the half-rate phase detector 210 on data lines 135. Alternately the data input may be single ended. Demuliplexed data is provided on lines 215 and 217. The half-rate phase detector compares data on lines 135 with the clock signals on line 147, and outputs an ERROR signal on line 222 that is proportional to the phase error between the clock and data signals. The half-rate phase detector 210 provides this ERROR signal on line 222, as well as a REFERENCE signal on line 224 to charge pump 220. The REFERENCE signal on line 224 is a data dependent signal which is used to correct for the data dependence of the ERROR signal on line 222. Charge pump 220 provides a correction signal that is filtered by low-pass filter 230, and sent to the VCO 240. VCO 240 provides the differential clock signal on line 147 which is used by the half-rate phase detector 210 for retiming the data input signal. These blocks form a feedback loop in which a clock signal is extracted from an incoming data stream, and used to retime the data.

As its name implies, the voltage controlled oscillator is an oscillator, the frequency of which is controlled by a voltage, in this case the voltage Vtune provided by the low-pass filter 230. As the voltage out of the filter 230 changes, so does the oscillation frequency. If the data on line 135 and the clock on line 147 do not have the desired phase relationship, for example the data edges are occurring too soon, the half-rate phase detector 210 outputs an ERROR voltage. This voltage drives the charge pump 220, the output of which is filtered and applied to the VCO 240. This voltage has the result of increasing the VCO frequency, such that the clock edges advance. When the desired phase relationship is achieved, Vtune changes such that the frequency drops back to the "correct" frequency, and this loop is said to be locked. Hence, these clock and data recovery circuits are often referred to as phase-locked loops, or PLLs.

The frequency of the clock signal on line 147 is half the data rate of the DATA signal on lines 135. The frequency of the half-rate phase detector outputs, DATA1 on line 215, and DATA2 on line 217, are each half the frequency of the DATA signal on lines 135. Also, the ERROR signal on line 222 and the REFERENCE signal on line 224 provide a relatively low frequency, essentially differential, correction signal.

These features provide several important benefits. For example, using a REFERENCE signal gives context to the ERROR signal, reducing any loop dependency on the data pattern on DATA lines 135. If there are no data transitions this loop has no ERROR or REFERENCE signal information to use to lock, but since there is no data to recover, this special case is of no interest.

Further, the VCO 240 operates at half the frequency as compared to conventional architectures. This not only saves power and simplifies the circuit design, but also enables using slower, more economical processes to achieve the same system function and performance. Similarly, higher performing circuits may be implemented on the same process as compared to other architectures. For example, the data rate may be 10 Gbits/sec, while the VCO runs at 5 GHz. Using two data outputs each operating at half the data rate also saves power. This is because it generally takes more than twice the power to double circuit speed in the absence of any design improvements. That is, a point of diminishing returns is reached where the application of more power fails to increase circuit speed proportionately. Therefore, reducing the switching requirements by half results in a greater than expected power savings. Architectures consistent with the present invention allow low cost processes to be used in demanding applications, for which they would not otherwise be suitable.

Also, conventional systems often employ what is known as a "bang-bang" phase detector. In bang-bang detectors, for each data edge, depending on its relation to the clock, a charge-up or charge-down signal is sent to a charge pump. Such detectors alternate between advancing and delaying the clock signal from the VCO, and never reach a stable point. Accordingly, bang-bang detectors always have a systematic jitter. Moreover, these pulses have fast edges containing high frequency components that couple to the supply voltage and inject noise into other circuits. Reducing this noise requires either filtering, or using separate supply lines decoupled from each other. By using a low frequency, effectively differential signal out, the linear half-rate phase detector of the present invention does not have this systematic jitter, and does not disturb the power supply and other circuits to the same extent.

Figure 3:
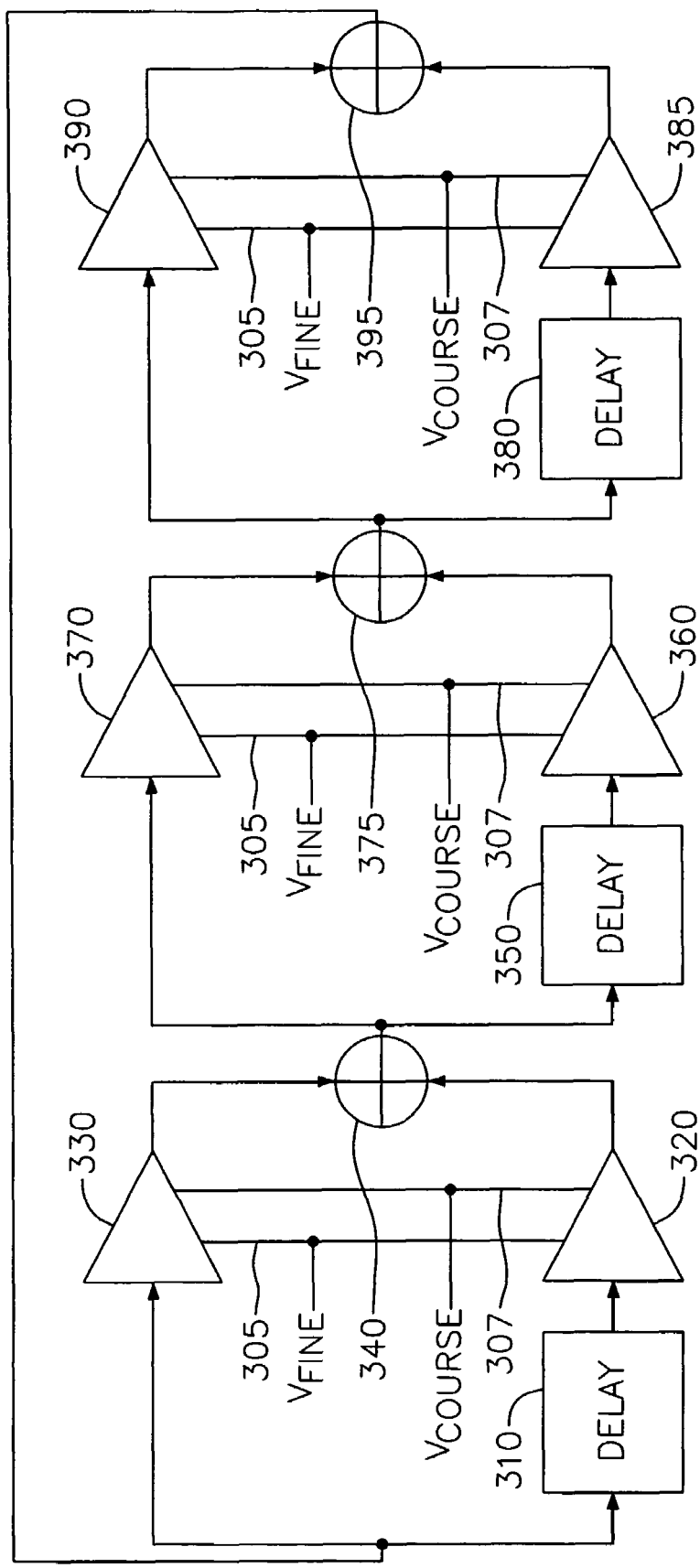
FIG. 3 is a block diagram of a VCO that may be used in a clock and data recovery circuit consistent with one embodiment of the present invention.

FIG. 3 is a block diagram for a VCO 300, which may be used as the VCO 240 in FIG. 2. VCO 300 includes three inverter elements in series. This architecture is generally known as a ring oscillator. The first inverter element is comprised of inverter 330, inverter 320, delay 310, and summing junction 340. The second inverter element includes inverter 370, inverter 360, delay 350, and summing junction 375. The third inverter element is comprised of inverter 390, inverter 385, delay 380, and summing junction 395. Clock signals at the output of summing junction 340 are driven through inverter 370, and also through delay 350 and inverter 360, to the summing junction 375. Signals Vfine and Vcourse on lines 305 and 307 adjust the relative weighting of these two paths. For example, if inverter 360 is off and inverter 370 is on, the clock signal at 340 drives through inverter 370 to summing junction 375 with a minimum delay. If inverter 370 is off and inverter 360 is on, the clock signal at summing junction 340 drives through the delay 350 and the inverter 360, and the signal is delayed a maximum amount. Alternately, inverter 370 and inverter 360 may each be partially on, such that the signal at summing junction 375 is a composite of signals traveling through inverter 370, and delay 350 and inverter 360. In this case the delay from summing junction 340 to summing junction 375 is somewhere between the minimum and maximum delays.

Figure 4:
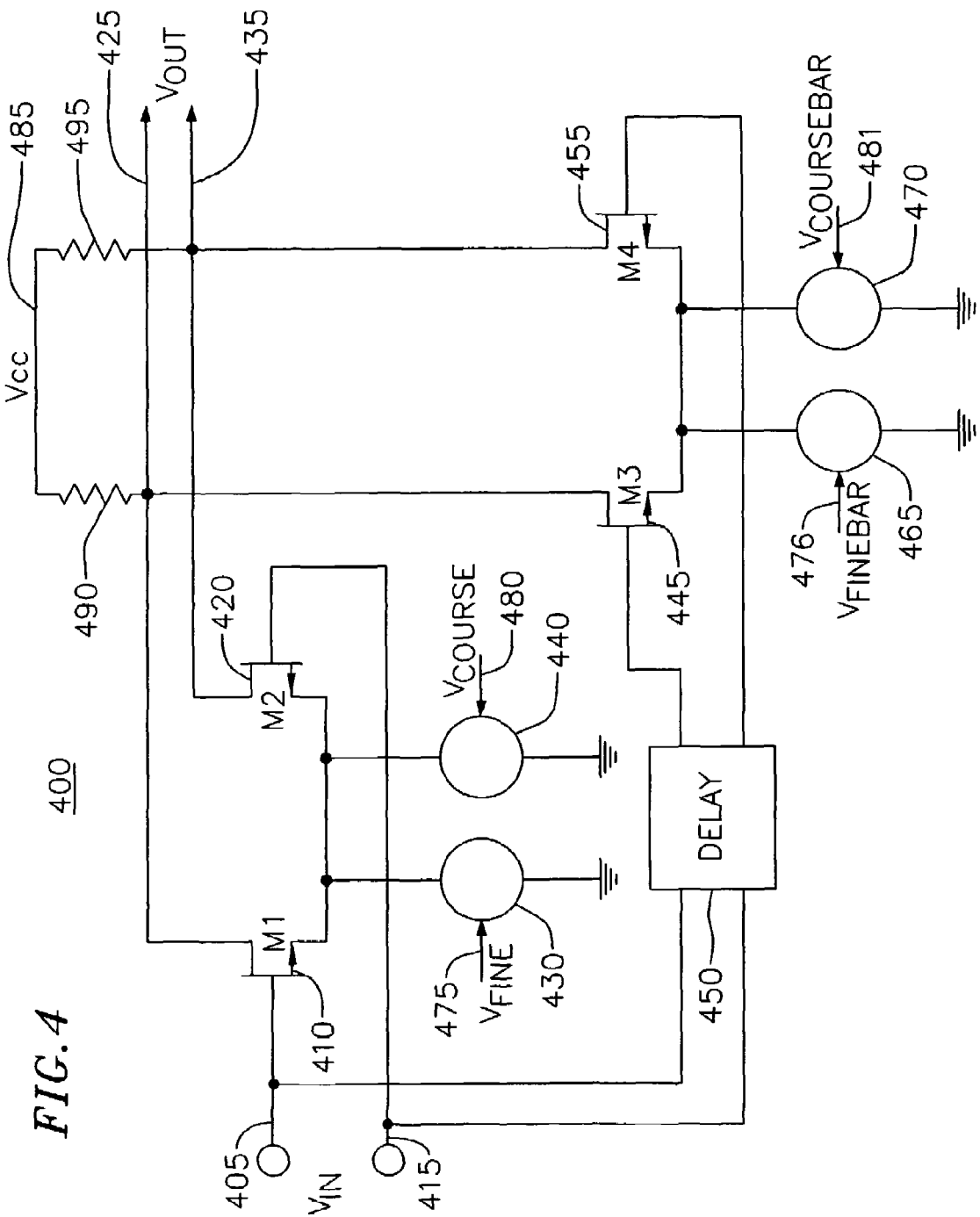
FIG. 4 is a schematic of one inverter element of the VCO in FIG. 3.

FIG. 4 is a schematic for one of the three VCO inverter elements shown in FIG. 3. Included are a first inverter stage including M1 410, M2 420, and current sources 430 and 440, and second inverter stage including M3 445, M4 445, and current sources 465 and 470. The first inverter and the second inverter outputs share load resistors 490 and 495, which correspond to the summing junctions shown in FIG. 3. Signal Vin at lines 405 and 415 coupled to the first inverter stage and the delay 450. The delay 450 in turn couples to the second inverter. Signals Vfine on lines 475 and Vcourse on line 480, and their compliments on lines 476 and 481, adjust the relative weighting of each inverter's contribution to the output signal Vout at lines 425 and 435. Using separate fine and course current sources allow for accurate overall delay control and greater noise immunity. The Vout signal at lines 425 and 435 couple to the next inverter cell's Vin lines 405 and 415.

As an example, when Vin is asserted high, that is the voltage on line 405 rises above the voltage on line 415, M1 410 turns on, and conducts current from the current sources 430 and 440. This current flows through load resistor 490, dropping the voltage on line 425 in relation to line 435.

Similarly, after the delay set by delay block 450, M3 445 turns on and begins to conduct current from current sources 465 and 470. This current also flows through load resistor 490, thus completing Vout's high to low transition.

With regards to the specific example shown in FIG. 2, a differential Vtune voltage from the low-pass filter 230 could be used to drive the Vfine and Vfinebar inputs, while the Vcourse and Vcoursebar voltages could be driven by a second loop used for achieving frequency lock. Alternately, the same loop could be used for frequency lock, or the same loop with some modifications could be used.

Figure 5:
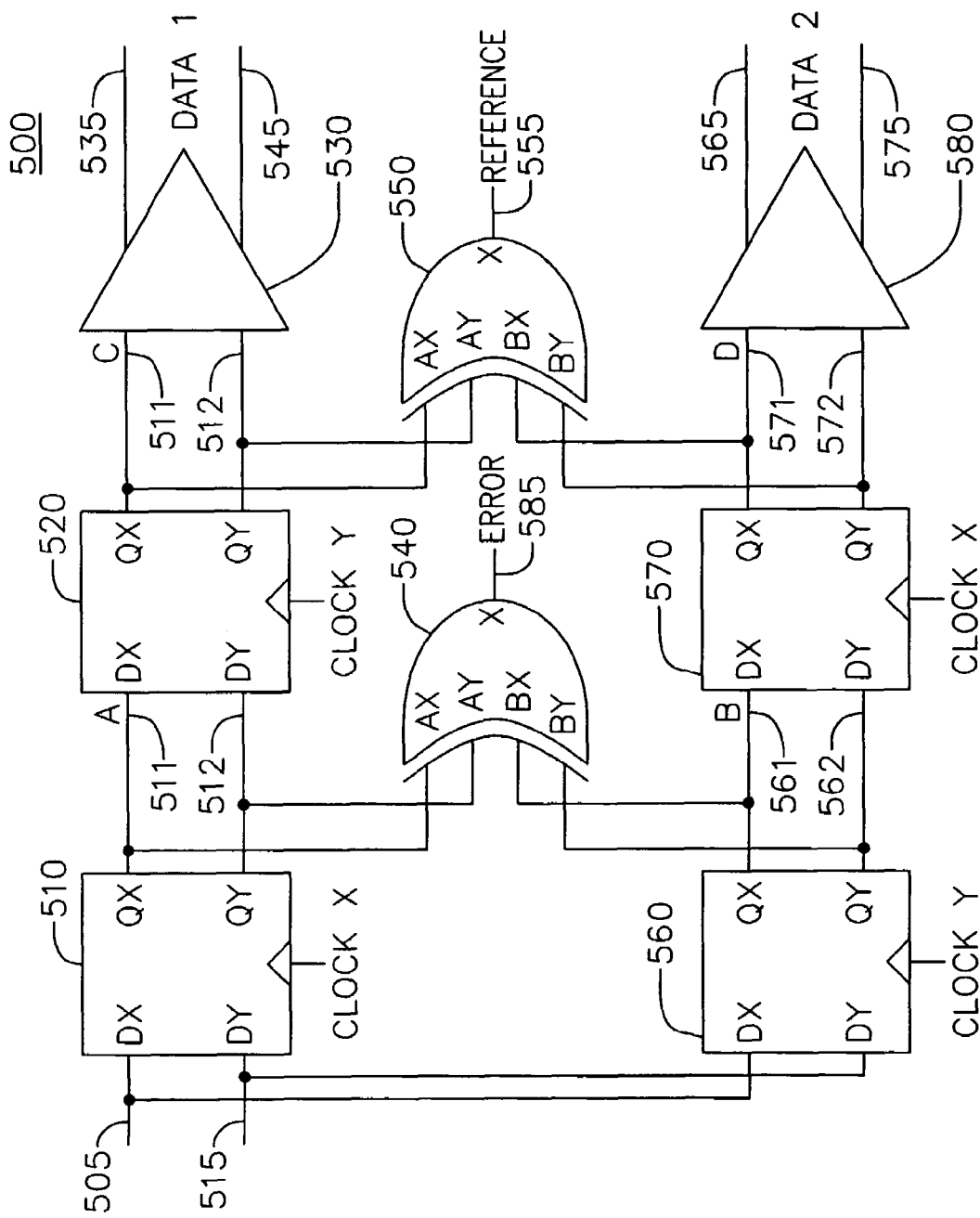
FIG. 5 illustrates a block diagram of a half-rate phase detector that may be used in a clock and data recovery circuit consistent with one embodiment of the present invention.

FIG. 5 is a block diagram for a half-rate phase detector which may be used as block 140 in the transceiver of FIG. 1, as well as other applications. Included are a first latch 510, a second latch 520, a third latch 560, a fourth latch 570, first XOR gate 540, second XOR gate 550, and buffers 530 and 580. All signal paths are shown as being differential, but may alternately be single-ended. For example, the DATA may be a single-ended signal on line 505, with line 515 coupled to a bias point, preferably at a voltage approximately equal to the middle of the DATA input voltage swing. In the preferred embodiment shown here, all signal paths are differential, except for the ERROR and REFERENCE signal paths, which are single-ended. Using differential signals reduces the jitter caused by noise from such sources as the power supply and bias lines. Modifications to this block diagram will be readily apparent to one skilled in the art. For example, the first and second latches may be replaced by a flip-flop.

Clock signal CLOCKX clocks the first latch 510 and the fourth latch 570. Complementary clock signal CLOCKY clocks the second latch 520 and the third latch 560. Differential data signal is provided on lines 505 and 515 to the first latch 510 and the third latch 560. When the CLOCKX line is high, data on lines 505 and 515 pass to the A lines 511 and 512. When CLOCKX is low, data on lines 505 and 515 are latched in first latch 510. Conversely, when the CLOCKX signal is high, the CLOCKY signal is low, and data on lines 505 and 515 are latched by the third latch 560. When the CLOCKY signal is high, data on lines 505 and 515 pass to the B lines 561 and 562 at the output of the third latch 560. Signals on the A line 511 and 512, and the B lines 561 and 562 are XORed by the first XOR gate 540 producing an ERROR signal on line 585.

Signals on the A lines 511 and 512, and the B lines 561 and 562, are latched by the second latch 520 and the fourth latch 570. Specifically, when the CLOCKY signal is high, the signal on lines 511 and 512 pass through the second latch 520 to lines C 521 and 522. But when CLOCKY is low data on lines 511 and 512 are latched by the second latched 520. Similarly when CLOCKX is high, data on the B lines 561 and 562 pass through the fourth latch 570 to the D lines 571 and 572. When CLOCKX is low, data on the B lines 561 and 562 are latched by the fourth latch 570. Data at the outputs of the second latch 520 and the outputs of the fourth latch 570 are XORed by the second XOR gate 550 producing a REFERENCE signal on line 555. Data at the outputs of the second latch 520, the C lines 521 and 522, drive the first buffer 530 which outputs the first demultiplexed data signal on lines 535 and 545. The outputs of the fourth latch 570, lines D 571 and 572, drive the second buffer 580, which outputs the second demultiplexed data signal on lines 565 and 575. The ERROR signal on line 585 and REFERENCE signal on line 555 are sent to the charge pump.

To improve performance, some circuit delay time and trace paths should be matched to each other. Specifically, the first latch clock-to-output delay and the traces coupling the first latch to the second latch and the XOR gate 540 should match the third latch clock-to-output delay and the traces coupling the third latch to the fourth latch and the XOR gate 540. Also, the second latch clock-to-output delay and the traces coupling the second latch to the buffer 530 and the XOR gate 550 should match the fourth latch clock-to-output delay and the traces coupling the fourth latch to the buffer 580 and the XOR gate 550.

Figure 6:
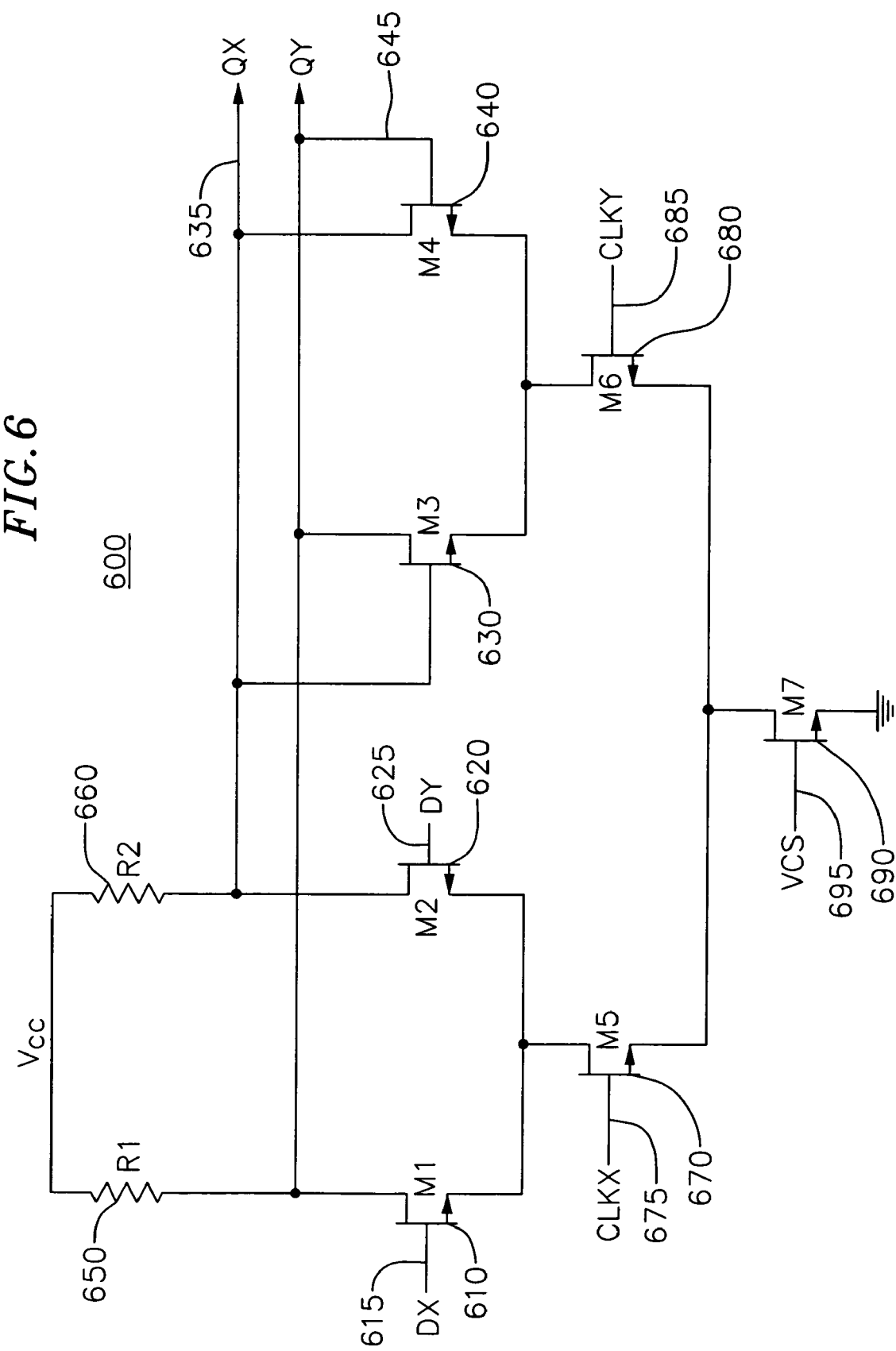
FIG. 6 is a schematic of a latch that may be used in the half-rate phase detector of FIG. 5.

FIG. 6 is a schematic for an exemplary circuit implementation of a latch used for the first latch 510, and fourth latch 570, in FIG. 5 by one embodiment of the present invention. It will be obvious to one skilled in the art that other latches can be used, for example a bipolar latch could be used. The second latch 520 and third latch 560 may be similar, with the exception that the CLOCKX and CLOCKY terminals are reversed. Included are input differential pair devices M1 610 and M2 620, latching devices M3 630 and M4 640, clock input devices M5 670 and M6 680, and current source M7 690. Current for the latch is generated by M7 690. A voltage VCS is applied to the gate of M7 690 resulting in a bias current flowing in its drain. This current is steered through either M5 670, or M6 680, by the CLOCKX and CLOCKY signals on lines 675 and 685. If the voltage on line 675 is higher than the voltage on 685, that is CLOCKX is high and CLOCKY is a low, the drain current of M7 is steered through M5 670 to the differential pair M1 610 and M2 620. In this case, the signals DX on line 615 and DY 625 are passed to the output lines QX 635 and QY 645. For example, if the signal DX on line 615 is higher than the signal DY on line 625, the current from M5 670 flows through M1 610 across load 650 pulling QY line 645 low. M2 620 is off, the voltage at QX lines 635 is pulled up to VCC, and is high. Conversely, if the signal DX on line 615 is lower than the signal DY on line 625, M1 is off, QY is high, M2 is on, and the current from M5 flows through the load resistor R2 660 and the signal QX 635 is low.

If the signal CLOCKX on line 675 is lower than the voltage of the signal CLOCKY on line 685, M5 is off, and the current from the drain of M7 690 passes through M6 680. If QX on line 635 is high and the signal QY on line 645 is low, M3 630 is on, and M4 640 is off. The current from M6 680 flows through M3 630 across load resistor R1 650 pulling down and keeping QY on line 645 low. M4 649 is off, whereby the signal QX on line 635 remains high. In this way the data on lines QX 635 and QY 645 remain latched. Input pair devices M1 and M2 are both off, so any signal changes at DX and DY, lines 615 and 625 have no effect on the output signals QX and QY on lines 635 and 645.

Figures 7A, 7B:
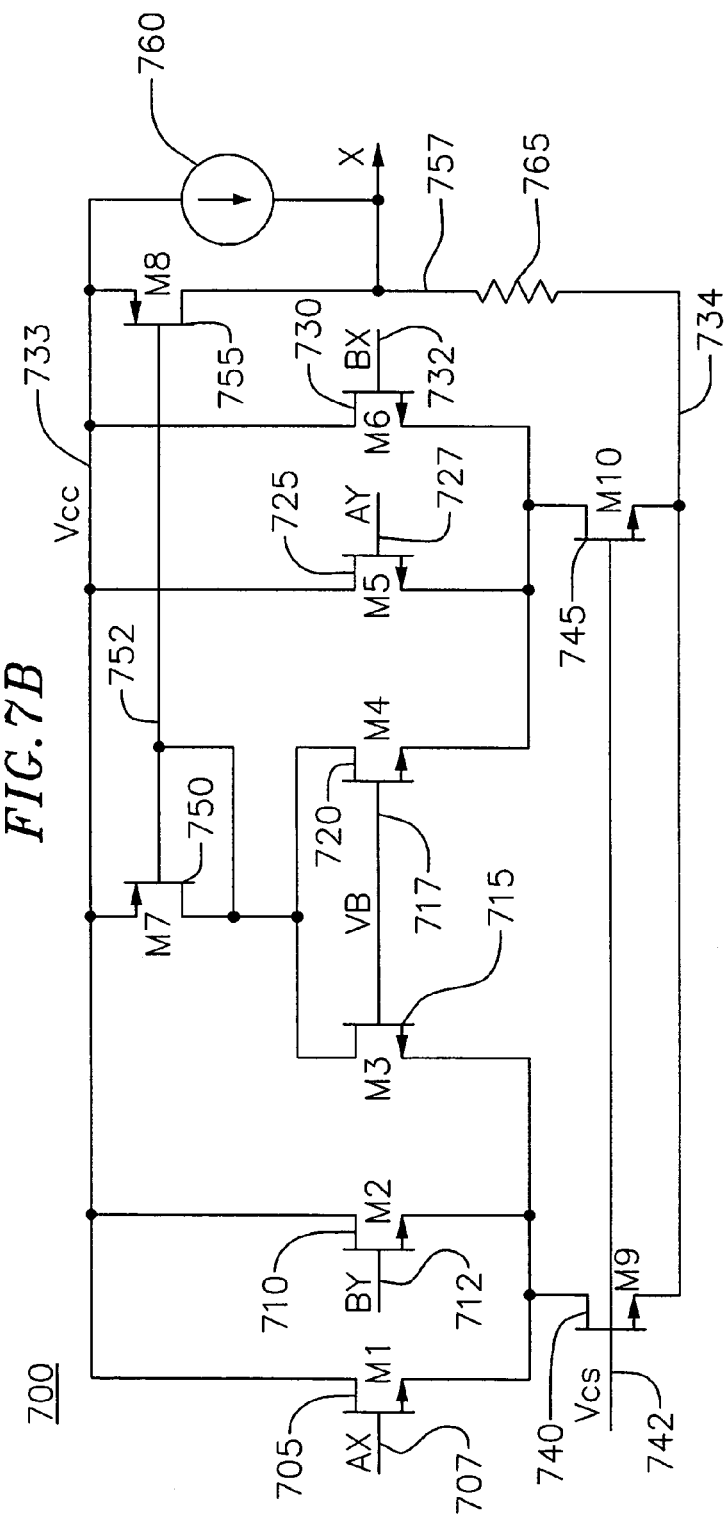
FIG. 7A is a truth table.
FIG. 7B is a schematic of an exclusive-OR gate that may be used in the half-rate phase detector of FIG. 5.

FIG. 7A is a truth table for an XOR gate. The XOR function is deconstructed into the OR of 2 NOR terms in column 702. The XOR gate shown in FIG. 7B is designed using this equivalent expression.

FIG. 7B is an exemplary XOR gate implemented in accordance with truth table column 702 of FIG. 7A. The alternative expression from FIG. 7A allows for designing an XOR gate without using stacked devices. This in turn, eliminates the mismatch between gate delays for different inputs which otherwise result. Included in this XOR gate are a first NOR gate including M1 705, M2 710, and M3 715, a second NOR gate including M4 720, M5 725, and M6 730, current sources M9 740 and M10 745, output current mirror M7 750 and M8 755, output load resistor 765, and output offset current source 760.

Bias voltage VCS is applied to the gates of M9 740 and M10 745, thereby generating bias currents in their drains. The signals AX on line 707 and BY on line 712 swing above and below the signal voltage VB on line 717. For example if either AX or BY are higher than VB, the drain current of M9 is shunted through M1 705 or M2 710 to VCC, line 733. If both the AX signal on line 707 and the BY signal on line 712 are low or below the voltage VB on line 717, the current from the drain of M9 passes through M3 715 to M7 750. Similarly, only if the signals AY on line 727 and BX on line 732 are low or below the voltage VB on line 717, does the current from the drain of M10 pass through the device M4 720 to M7 750. Current in M7 750 is mirrored in the drain of M8 755 and applied across output load resistor 765, generating a voltage at the X output on line 757. Output offset current 760 creates a DC voltage at the output for proper biasing to the charge pump.

Using PMOS devices for M7 750 and M8 755 limits the ERROR and REFERENCE signals' bandwidth. The XOR gate smoothes the logical outcome by first performing a high-speed logical operation, and then low-pass filtering the output. But this is advantageous to the overall system. For example, the power supply noise injected by this XOR gate is very limited, since high frequencies are attenuated by the PMOS mirror. Also, this gate provides some high frequency filtering, thus reducing the burden on the following charge pump and low-pass filter.

An alternate embodiment for an XOR gate can be found in commonly assigned U.S. Provisional Patent Application Ser. No. 60/183,169, filed Feb. 17, 2000, titled "Linear Full-Rate Phase Detector and Clock Data Recovery Circuit Using the Same,". Also, other architectures which may be used to implement some of the circuits herein can be found in commonly assigned U.S. Pat. No. 6,424,194, titled "Current Controlled CMOS Logic Family,", which is incorporated herein by reference.

Figure 8:
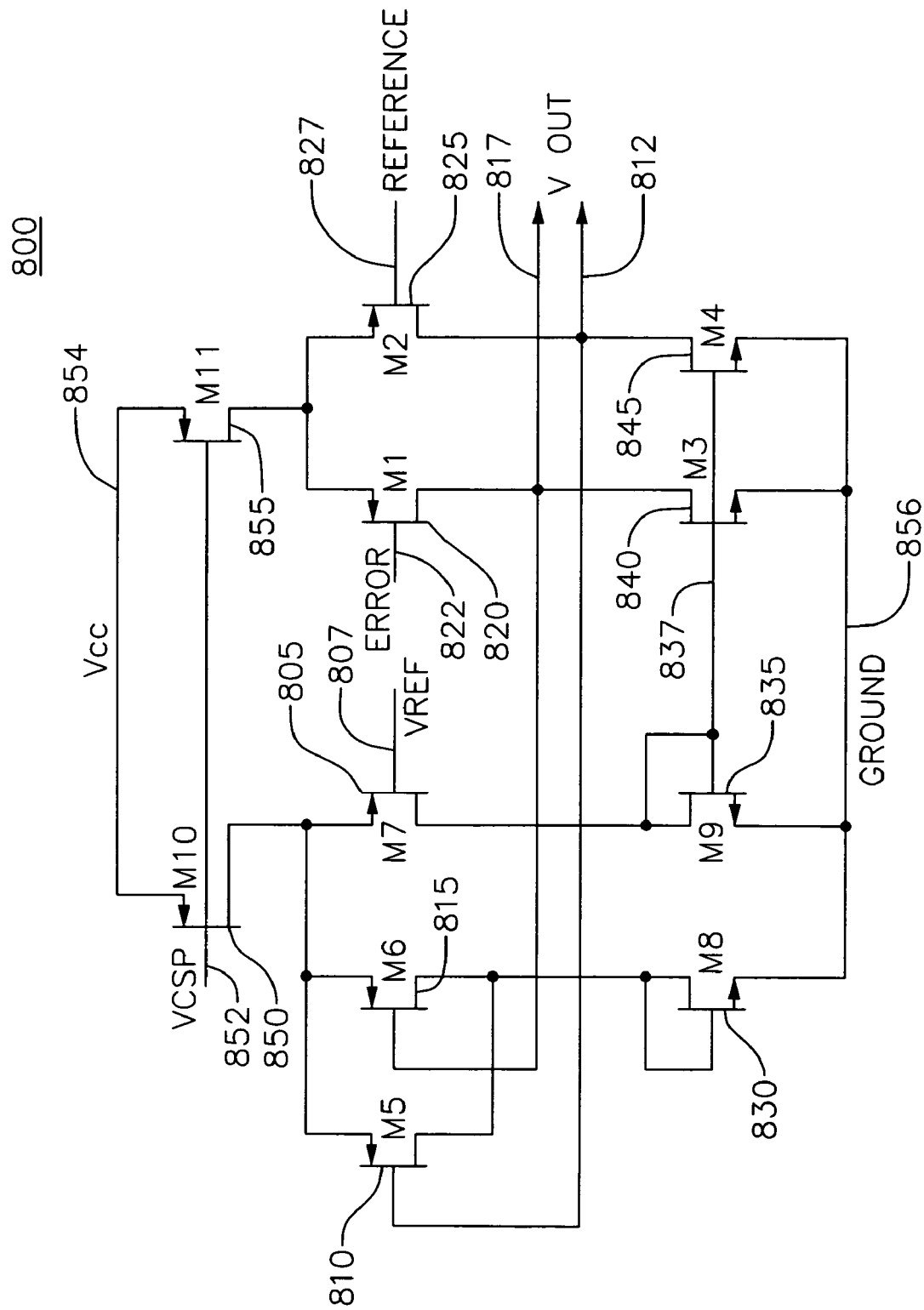
FIG. 8 is a charge pump that may used by one embodiment of the present invention.

FIG. 8 is a charge pump which may be used as charge pump 220 in FIG. 2, as well as other applications. Included are a common mode circuit including M7 805, M5 810, M6 815, M8 830, M9 835, and amplifier including M1 820, M2 825, M3 840, and M4 845, and current sources M10 850 and M11 855. The ERROR signal on line 822, and the REFERENCE signal on line 827, are provided as differential inputs to the amplifier. Bias voltage VCSP is applied to the gates of M10 850 and M11 855, thereby generating currents in their drains. If the ERROR voltage on line 822 rises above the REFERENCE voltage on line 827, the current through M1 increases and the voltage on line 817 increases. Correspondingly the current and M2 825 decrease, thereby lowering the voltage on line 812.

If the common mode voltage on lines 817 and 812 is too high, devices M5 810 and M6 815 shut off. The current in M7 805 increases, thus increasing the current in M9 835 which is mirrored in devices M3 840 and M4 845. This increase in current tends to drive down the voltages on lines 817 and 812. In this way, Vout's common mode is adjusted to be centered around the voltage Vref on line 807. The charge pump provides a differential output voltage proportional to the difference between the ERROR and REFERENCE signals, and provides them at the correct bias point for use by following circuits.

Figure 9:
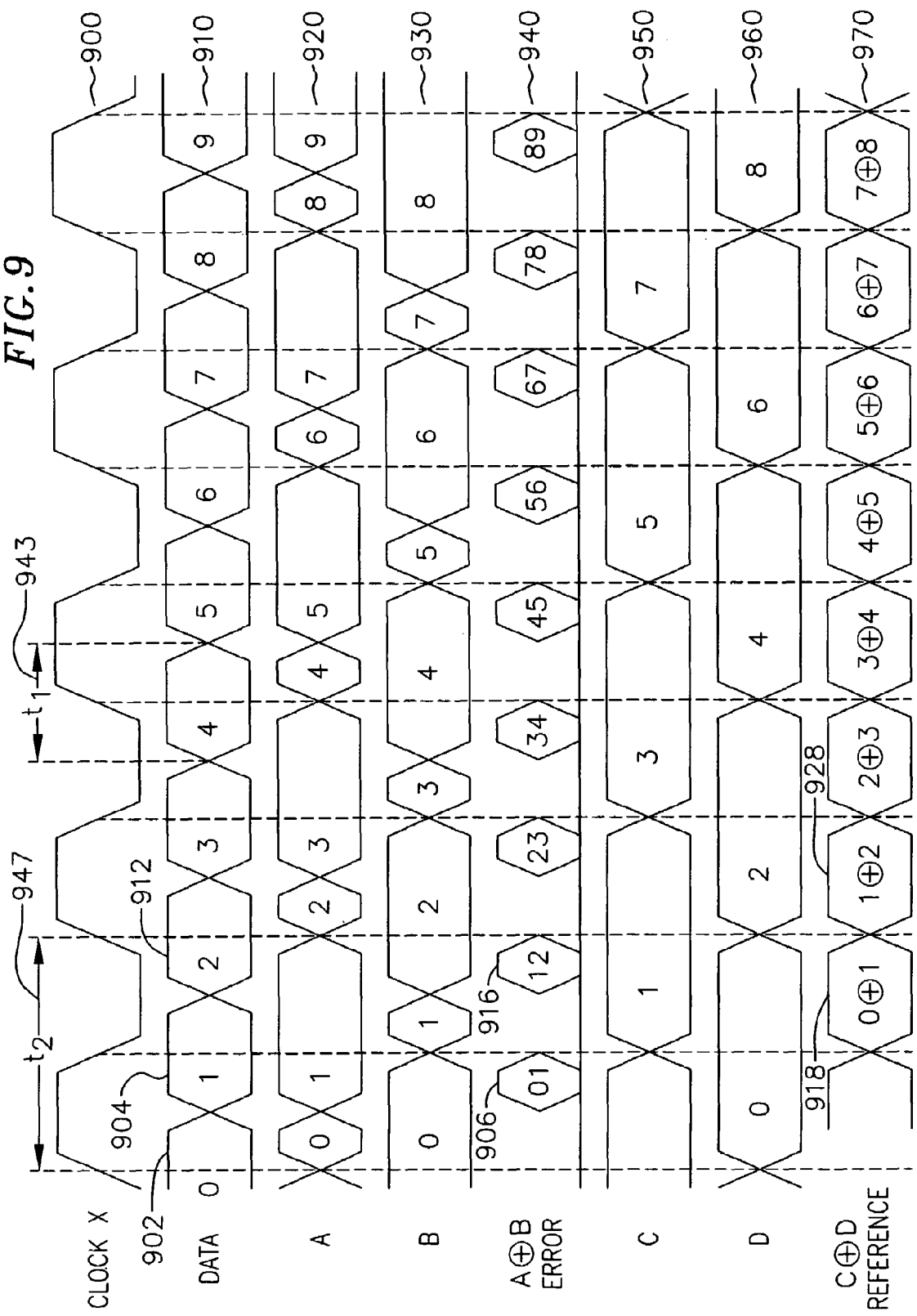
FIG. 9 is a generalized timing diagram for a phase detector consistent with one embodiment of the present invention.

FIG. 9 is a timing diagram for a half-rate phase detector consistent with one embodiment of the present invention, such as the circuit illustrated in FIG. 5. This and the following timing diagrams are not limited to the circuit shown in FIG. 5 however, and may be generated by other circuitry consistent with the present invention. Shown are input waveforms CLOCKX 900 and DATA 910, and resulting waveforms A 920, B 930, ERROR 940, C 950, D 960, and REFERENCE 970. In a preferred embodiment, CLOCKX 900 is approximately a 50 percent duty cycle waveform, but clock signals with other duty cycles, such as 33 or 67 percent may be used. Alternately, other duty cycles may be used consistent with the present invention, such as 40 or 60 percent. Waveform A 920 follows the DATA signal 910 when CLOCKX 900 is high. When CLOCKX 900 returns low, the signal on waveform A 920 is latched, or stored, and does not respond to changes in DATA 910. Conversely, waveform B 930 follows the DATA signal 910 when CLOCKX 900 is low. When CLOCKX 900 returns high, the signal on B 930 is latched, or stored, and does not respond to changes in DATA 910.

The signal A 920 is XORed with the signal B 930, resulting in the ERROR waveform 940. For some time following each CLOCKX rising and falling edge, the A 920 and B 930 signal levels are equal. This is because one signal has just latched, while the other had been latched and is now following the DATA signal 910. During this time the ERROR 940 signal level is low. If the signal level at DATA 910 changes, the ERROR signal 940 is asserted high. If the DATA 910 signal level does not change, but rather remains constant, ERROR 940 remains low. For example if data bit 902 and data bit 904 are both low, then ERROR signal portion 906 is low.

Waveform C 950 follows signal A 920 when CLOCKX 900 is low. When CLOCKX 900 returns high, C 950 is latched, its value stored, and accordingly its value is retained until CLOCKX 900 returns low. Waveform D 960 follows signal B 930 when CLOCKX 900 is high. When CLOCKX 900 returns low, signal D 960 is latched, its value stored, and so its value is retained until CLOCKX 900 returns high. Signals C 950 and D 960 are the demultiplexed data outputs. For example, data bits of DATA signal 910 have been sequentially labeled 0, 1, 2, and so on. Waveform C 950 comprises the odd bits of DATA waveform 910, and waveform D 960 comprises 0 and the even bits of DATA waveform 910. Waveforms C 950 and D 960 are XORed, resulting in REFERENCE 970.

ERROR signal 940 is dependent on the phase relationship between DATA 910 and CLOCKX 900 in the following manner. For example, if data bit 904 is low and data bit 912 is a high, then ERROR pulse 916 is high. If the DATA signal 910 advances, that is shifted to the left, then pulse 916 in the ERROR signal 940 widens (becomes longer in duration). If the DATA signal 910 is delayed, that is shifted to the right, then pulse 916 of ERROR signal 940 narrows (becomes shorter in duration). But note as above, if data pulse 904 and data pulse 912 are equal, then data pulse 916 is low. Therefore, the average voltage of ERROR waveform 940 is dependent not only on the phase error between CLOCKX 900 and DATA 910, but on the data pattern of DATA 910. For this reason, the ERROR signal 940 is most meaningful in the context of REFERENCE signal 970.

If we assume random data, that is the probability of each in data bit and 902 being high or low is equal, then half of all ERROR pulses 906 are high and half are low. If the CLOCKX 900 and DATA 910 signals are in quadrature, that is they are at right angles or ninety degrees shifted apart, then for half the time between clock edges the ERROR signal 940 is low, and half the time it is an ERROR pulse that may be low or high. Accordingly, for random data, when phase lock is achieved, the average signal level of ERROR signal 940 is one-fourth its peak value.

The average value of REFERENCE signal 970 is also data dependent. For example, if data bit 902 and 904 are both low then REFERENCE bit 918 is low. But if data bit 904 and data bit 912 are not equal, REFERENCE bit 928 is high. For random data the probability of two consecutive bits being equal is the same as the probability of two consecutive bits being unequal. Thus, half the REFERENCE bits 918 are low, and half are high. Therefore, the average value of the REFERENCE signal 970 is half its peak value.

If the data is not random, for instance if DATA 910 is a long string of either high or low data bits, then ERROR pulses, such as 906, and REFERENCE pulses, such as 917 are low. The ERROR signal's average value is at a minimum, as is the REFERENCE signal 970. But if the data changes every bit, then each ERROR signal pulse and each REFERENCE bit is high. Therefore the ERROR signal is equal to half its peak value and the REFERENCE signal equals its peak value. Thus, the ERROR signal and REFERENCE signal divided by two have the same data pattern dependency, while the ERROR signal also tracks the phase error. This means the data dependency of ERROR signal 940 can be corrected by subtracting half the average value of the REFERENCE signal 970. From a circuitry implementation, this means in FIG. 7, PMOS mirror devices M7 750 and M8 755 should be scaled differently for XOR gates 540 and 550 in FIG. 5. Specifically, either M8 can be doubled, or M7 can be halved in XOR gate 540 as compared to XOR gate 550. The difference signal between the ERROR and one-half the REFERENCE signals is not dependent on the data pattern, but is dependent on the phase error. This resulting signal has approximately a zero value when the DATA signal's edges are aligned with the center between the CLOCK edges. As the DATA is delayed, the differential value becomes negative. As the DATA advances, the difference becomes positive.

This pattern dependency reduction of the half-rate phase detector output reduces the pattern dependent phase error that would otherwise occur, though there may be random pattern dependent jitter that would remain unaffected.

Each data bit has a duration $t_1$ 943. The reciprocal of the data bit duration $t_1$ 943 is referred to as the data rate. Each clock period has a duration $t_2$ 947, where $t_2$ is equal to twice $t_1$. The clock frequency, or clock rate, is the reciprocal of the duration $t_2$ 947. Therefore, the clock frequency is half the data rate. It is interesting to note that the data and clock signals' switching frequency, that is the reciprocal of the duration between rising and falling edges, is the same. In conventional systems, the clock's switching rate is twice what is shown in FIG. 9. Accordingly, the VCO's bandwidth and related clock path for circuitry implementing FIG. 9 is half that of conventional systems. This provides a savings in power, and eases the complexity and risk of the circuit design.

Figure 10:
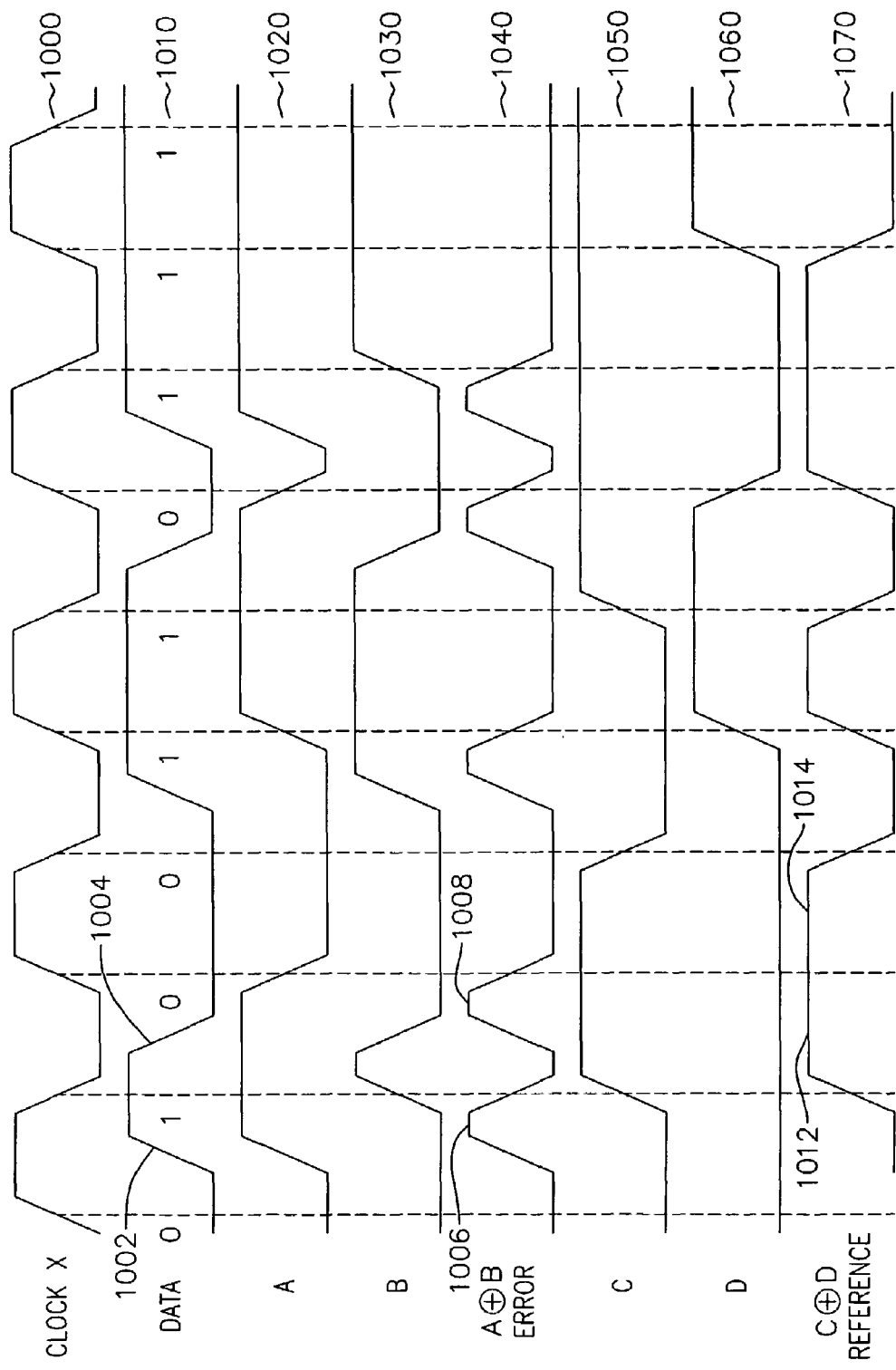
FIG. 10 illustrates the timing diagram of FIG. 9 with a specific data pattern and no phase error.

FIG. 10 is a timing diagram of the various waveforms for a half-rate phase detector used in one embodiment of the present invention. Included are input waveforms CLOCKX 1000 and DATA 1010, and resulting waveforms A 1020, B 1030, ERROR 1040, C 1050, D 1060, and REFERENCE 1070. This timing diagram is for a specific DATA 1010 input pattern. Each transition in DATA 1010, such as 1002 and 1004, results in pulses in ERROR signal 1040, specifically 1006 and 1008, and high REFERENCE bits 1012 and 1014.

Figure 11:
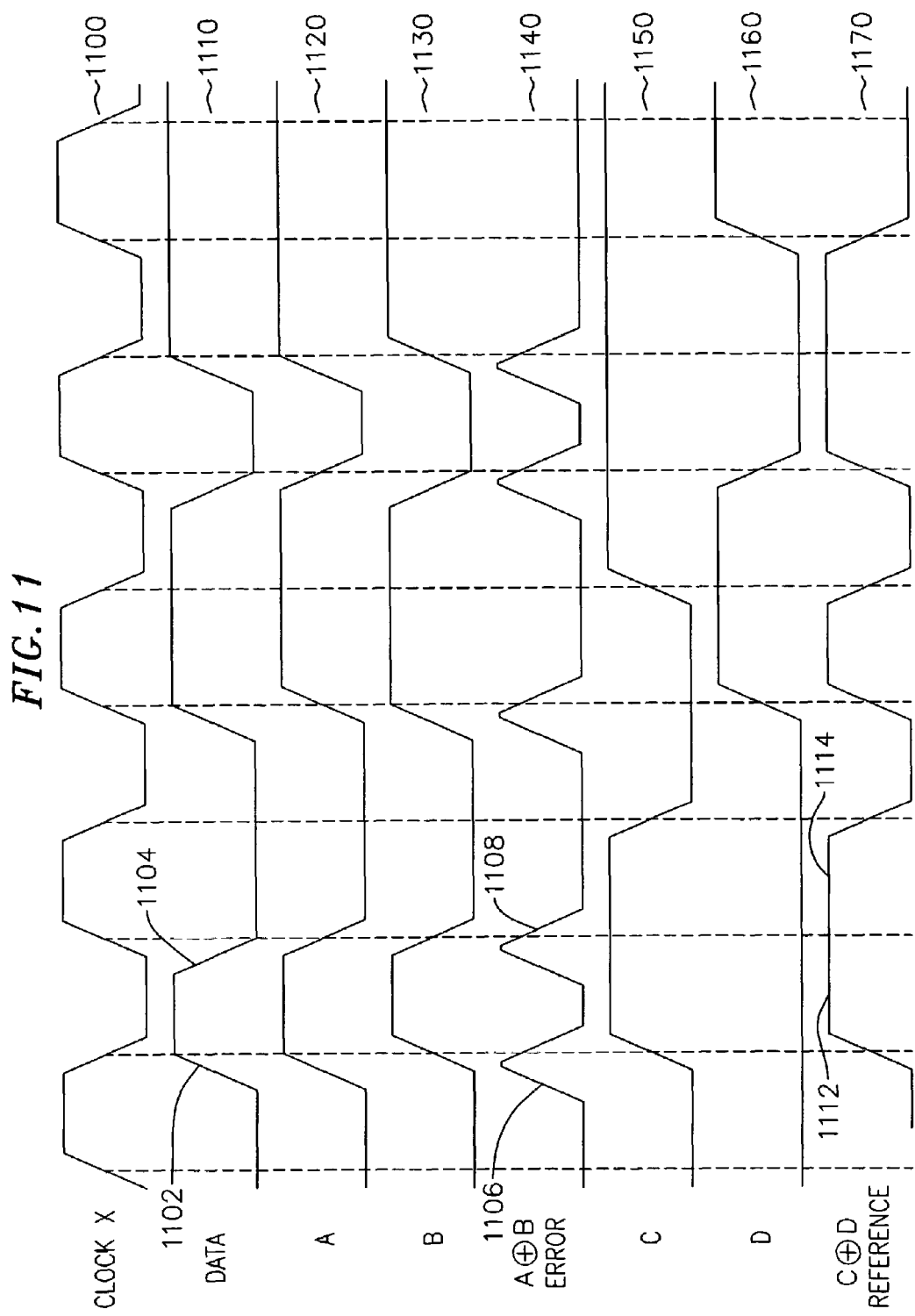
FIG. 11 is the timing diagram of FIG. 10 with a phase error introduced.

FIG. 11 is a timing diagram of the various waveforms for a half-rate phase detector used in one embodiment of the present invention. Included are input waveforms CLOCKX 1100 and DATA 1110, and resulting waveforms A 1120 B 1130, ERROR 1140, C 1150, D 1160, and REFERENCE 1170. DATA waveform 1110 is the same as DATA waveform 1010 in FIG. 10. In this specific example, DATA waveform 1110 has been delayed relative to CLOCKX waveform 1100. Again, each transition in DATA waveform 1110, such as 1102 and 1104, results in pulses in ERROR waveform 1140, specifically 1106 and 1108, and high REFERENCE bits 1112 and 1114. But this time, since the DATA waveform 1110 has been delayed, ERROR pulses 1106 and 1108 are narrower than the corresponding pulses 1006 and 1008 in FIG. 10. Accordingly, the average value of ERROR signal 1140 is lower than the average value of ERROR signal 1040 in FIG. 10. REFERENCE bits 1112 and 1114, however, are the same as REFERENCE bits 1012 and 1014 in FIG. 10. Therefore, the same DATA waveform 1110 in FIG. 11, and 1010 in FIG. 10, results in a lower ERROR value. But the same REFERENCE signal, shown as 1170 in FIG. 11 and 1070 in FIG. 10, is achieved, so the REFERENCE signal is independent of the phase error, but it is dependent on the data pattern.

Figure 12:
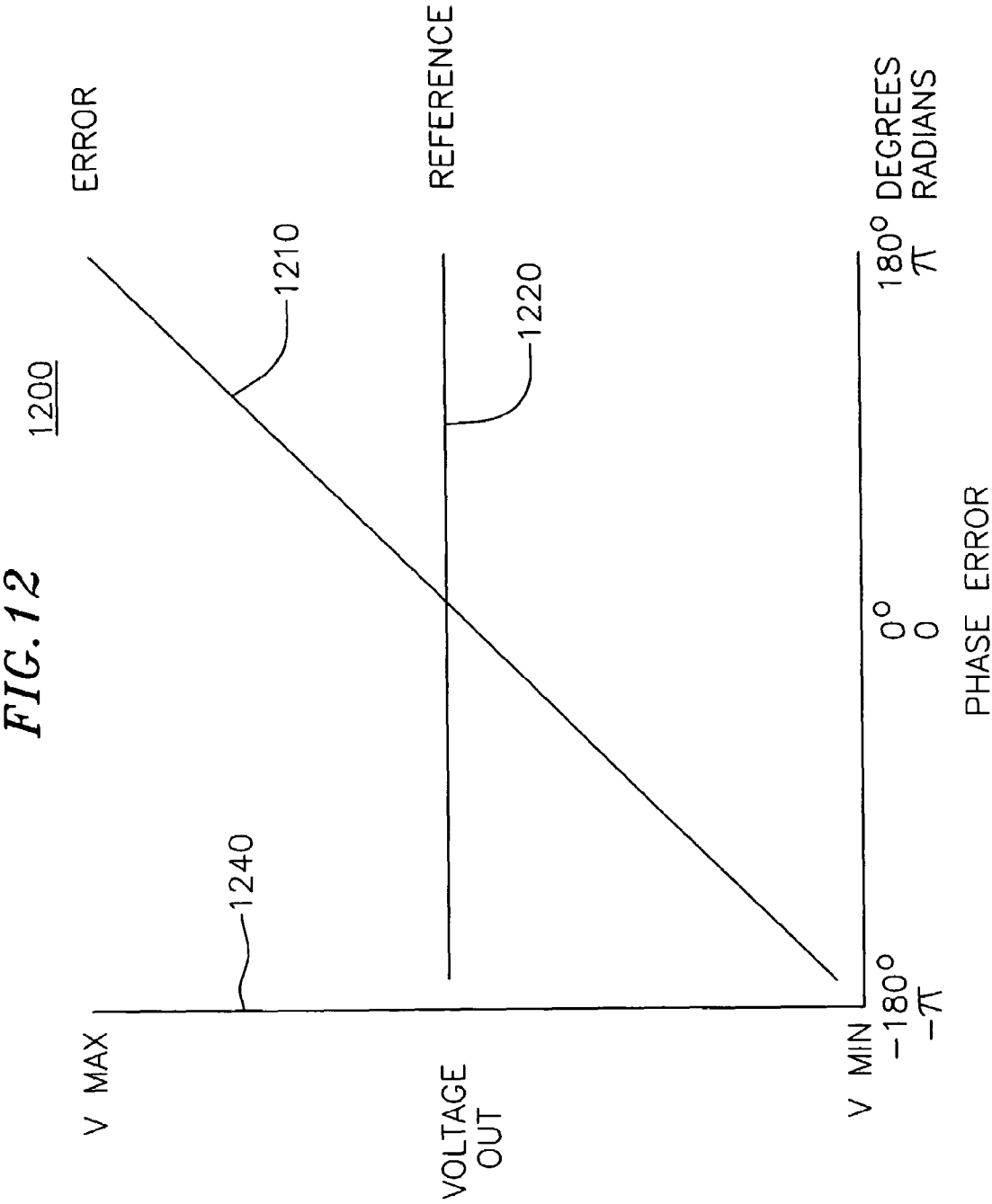
FIG. 12 shows the error and reference voltages as a function of phase error for a half-rate phase detector consistent with one embodiment of the present invention.

FIG. 12 graphs the ERROR voltage and REFERENCE voltage outputs for a half-rate phase detector consistent with one embodiment of the present invention. The voltages of ERROR signal 1210 and REFERENCE signal 1220 are graphed as a function of the phase error between the data and clock signals. ERROR signal 1210 is proportional to the phase error. ERROR signal 1210 may be linear. Alternately, ERROR signal may have nonlinear characteristics. REFERENCE signal 1220 is approximately independent of the phase error, but is a function of the data pattern. REFERENCE signal 1220 may become discontinuous or notched when the phase error is near plus or minus 180 degrees.

Figure 13:
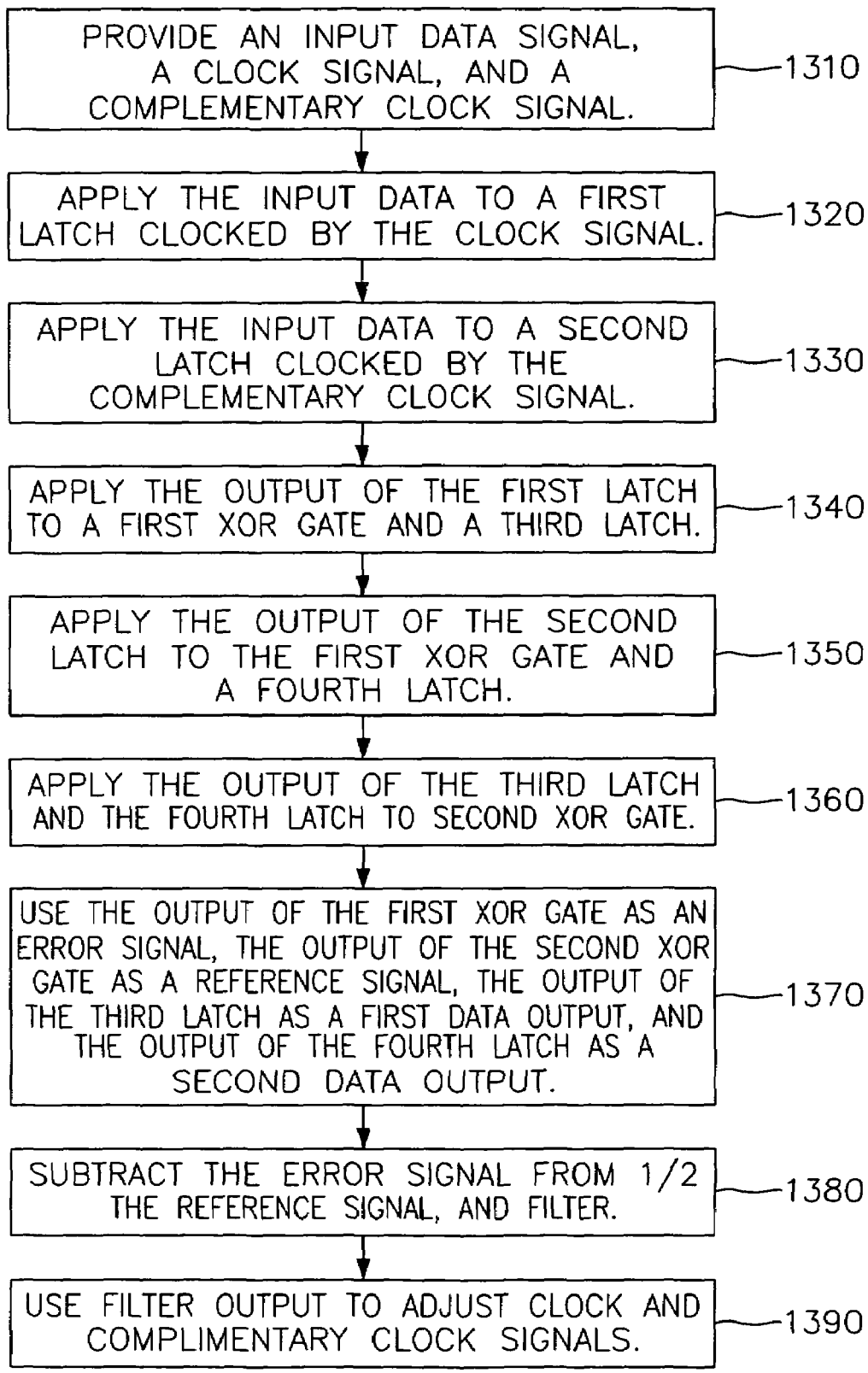
FIG. 13 is a flowchart for a method of recovering data and clock signals consistent with one embodiment of the present invention.

FIG. 13 is a flow chart for a method of recovering data and clock signals from a data stream consistent with one embodiment of the present invention. In act 1310, a data input signal, a clock signal, and the clock signal complement are provided. The data input is applied to a first latch clocked by the first clock signal in act 1320. The data is applied to a second latch clocked by the complementary clock signal in act 1330. In act 1340 the first latch's output is applied to a first XOR gate and a third latch. The second latch's output is applied to the first XOR gate and a fourth latch in act 1350. In act 1360, the third latch's output and the fourth latch's output are applied to a second XOR gate. The first XOR gate's output is used as an error signal, the second XOR gate's output is used as a reference signal, the third latch's output is used as a first data output, and the fourth latch's output is used as a second data output in act 1370.

In act 1380 the error signal is subtracted from half the reference signal, and filtered. The filter output is used to adjust the clock signal and its complement in act 1390.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. A clock and data recovery apparatus comprising:
   a voltage controlled oscillator configured to provide, at a clock output, a clock signal at substantially a first frequency;
   a half-rate phase detector comprising a data input configured to receive a data input signal having a data rate and a data pattern, wherein the data rate is substantially twice the first frequency, the half-rate phase detector further comprising a clock input, coupled to the clock output of the voltage controlled oscillator, to receive the clock signal;
   the half-rate phase detector further configured to provide a first signal and a second signal, and the first signal is dependent on the phase difference between the data input signal and the clock signal and also is dependent on the data pattern, and the second signal is dependent on the data pattern but is not dependent on the phase difference;

a charge pump coupled to receive the first signal and the second signal from the half-rate phase detector, wherein the charge pump combines the first signal and the second signal to generate an output signal that is dependent on the phase difference but is not dependent on the data pattern; and a low-pass filter coupled to receive the output signal from the charge pump and configured to provide a signal to the voltage controlled oscillator.

2. The apparatus of claim 1 wherein the clock and data recovery apparatus is configured to correct data dependency associated with the first signal by scaling at least one signal to effectively subtract substantially one-half of the average value of the second signal from the first signal.

3. The apparatus of claim 1 wherein the half-rate phase detector is configured to adjust a magnitude of at least one signal to provide the first signal and the second signal.

4. The apparatus of claim 3 wherein the half-rate phase detector comprises XOR gates that are scaled differently to provide the first signal and the second signal.

5. The apparatus of claim 4 wherein an XOR gate that generates the first signal comprises at least one transistor that is either substantially twice as large as or substantially half as small as a corresponding at least one transistor in an XOR gate that generates the second signal.

6. The apparatus of claim 3 wherein the difference between the first signal and the second signal is not dependent on the data pattern but is dependent on the phase difference.

7. The apparatus of claim 6 wherein the charge pump is configured to generate the output signal as a differential voltage signal that is proportional to the difference between the first signal and the second signal.

8. The apparatus of claim 1 wherein the half-rate phase detector is configured to low pass filter the first signal and the second signal.

9. The apparatus of claim 8 wherein the half-rate phase detector comprises XOR gates configured to low pass filter the first signal and the second signal.

10. The apparatus of claim 9 wherein the XOR gates comprise PMOS transistors configured to low pass filter the first signal and the second signal.

11. The apparatus of claim 1 wherein the charge pump generates the output signal by subtracting the second signal from the first signal.

12. The apparatus of claim 11 wherein the clock signal has approximately a fifty percent duty cycle.

13. The apparatus of claim 11 wherein the voltage controlled oscillator comprises a ring oscillator.

14. The apparatus of claim 1 wherein the first signal comprises an error signal and the second signal comprises a reference signal.

15. The apparatus of claim 1 wherein the half-rate phase detector is configured to output demultiplexed data signals.

16. The apparatus of claim 1 wherein the half-rate phase detector is configured to:

generate an initial first signal and an initial second signal; and adjust a magnitude of at least one of the initial first signal and the initial second signal to generate the first signal and the second signal, such that a relative magnitude of the first signal with respect to the second signal is substantially twice a relative magnitude of the initial first signal with respect to the initial second signal.

17. A clock and data recovery method comprising:

providing, by a voltage controlled oscillator, a clock signal at substantially a first frequency;

receiving, by a half-rate phase detector, a data input signal having a data rate and a data pattern, wherein the data rate is substantially twice the first frequency, receiving, by the half-rate phase detector, the clock signal;

providing, by the half-rate phase detector, a first signal dependent on the phase difference between the data input signal and the clock signal and also dependent on the data pattern;

providing, by the half-rate phase detector, a second signal dependent on the data pattern but not dependent on the phase difference;

receiving, by a charge pump, the first signal and the second signal;

combining, by the charge pump, the first signal and the second signal to generate an output signal that is dependent on the phase difference but is not dependent on the data pattern; and low-pass filtering the output signal to provide a signal to the voltage controlled oscillator.

18. The method of claim 17 comprising correcting data dependency associated with the first signal by scaling at least one signal to effectively subtract substantially one-half of the average value of the second signal from the first signal.

19. The method of claim 17 comprising adjusting a magnitude of at least one signal to provide the first signal and the second signal.

20. The method of claim 19 wherein the difference between the first signal and the second signal is not dependent on the data pattern but is dependent on the phase difference.

21. The method of claim 19 comprising generating the output signal as a differential voltage signal that is proportional to the difference between the first signal and the second signal.

22. The method of claim 17 wherein the half-rate phase detector low pass filters the first signal and the second signal.

23. The method of claim 17 wherein the charge pump generates the output signal by subtracting the second signal from the first signal.

24. The method of claim 17 wherein the first signal comprises an error signal and the second signal comprises a reference signal.

25. The method of claim 17 comprising providing, by the half-rate phase detector, demultiplexed data output signals.

26. The method of claim 17 comprising:

generating an initial first signal and an initial second signal; and adjusting a magnitude of at least one of the initial first signal and the initial second signal to generate the first signal and the second signal, such that a relative magnitude of the first signal with respect to the second signal is substantially twice a relative magnitude of the initial first signal to the initial second signal.

* * * * *